United States Patent
Apalkov et al.

(10) Patent No.: US 10,305,026 B2
(45) Date of Patent: May 28, 2019

(54) CROSS-POINT ARCHITECTURE FOR SPIN-TRANSFER TORQUE MAGNETORESISTIVE RANDOM ACCESS MEMORY WITH SPIN ORBIT WRITING

(71) Applicant: Samsung Electronics Co., Ltd., Suwon-si, Gyeonggi-do (KR)

(72) Inventors: Dmytro Apalkov, San Jose, CA (US); Vladimir Nikitin, Campbell, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 295 days.

(21) Appl. No.: 15/067,087

(22) Filed: Mar. 10, 2016

(65) Prior Publication Data

US 2017/0148978 A1 May 25, 2017

Related U.S. Application Data

(60) Provisional application No. 62/257,686, filed on Nov. 19, 2015.

(51) Int. Cl.
| | |
|---|---|
| *G11C 11/16* | (2006.01) |
| *H01L 43/08* | (2006.01) |
| *H01L 43/02* | (2006.01) |
| *H01L 43/10* | (2006.01) |
| *H01L 27/22* | (2006.01) |
| *H01L 43/12* | (2006.01) |

(52) U.S. Cl.
CPC ............ *H01L 43/08* (2013.01); *G11C 11/161* (2013.01); *G11C 11/1673* (2013.01); *G11C 11/1675* (2013.01); *H01L 27/222* (2013.01); *H01L 43/02* (2013.01); *H01L 43/10* (2013.01); *H01L 43/12* (2013.01)

(58) Field of Classification Search
CPC .................. G11C 11/15; G11C 11/161; G11C 2211/5616
See application file for complete search history.

(56) References Cited

U.S. PATENT DOCUMENTS

| | | | |
|---|---|---|---|
| 7,826,258 B2 | 11/2010 | Zhu et al. | |
| 8,294,227 B2 | 10/2012 | Zheng et al. | |
| 8,508,984 B2 * | 8/2013 | Ranjan | ................... H04L 43/08 364/158 |

(Continued)

OTHER PUBLICATIONS

Russek,et al., 38 Spin-Transfer Nano-Oscillators, Handbook of Naonphysics: Functional Nanomaterials, pp. 38-1-38-23; Mar. 22, 2010.

*Primary Examiner* — Mushfique Siddique
(74) *Attorney, Agent, or Firm* — Lewis Roca Rothgerber Christie LLP

(57) ABSTRACT

A magnetic memory cell includes: a first spin-orbit interaction active layer; a first magnetic free layer on the first spin-orbit interaction active layer, the first magnetic free layer having a changeable magnetization; a first nonmagnetic spacer layer on the first magnetic free layer; a reference layer having a fixed magnetization on the first nonmagnetic spacer layer; a second nonmagnetic spacer layer on the reference layer; a second magnetic free layer on the second nonmagnetic spacer layer, the second magnetic free layer having a changeable magnetization; and a second spin-orbit interaction active layer on the second magnetic free layer.

12 Claims, 15 Drawing Sheets

(56) References Cited

U.S. PATENT DOCUMENTS

| | | | | |
|---|---|---|---|---|
| 8,680,633 B1* | 3/2014 | Kato | ............... | H01L 43/10 |
| | | | | 257/421 |
| 8,896,041 B2 | 11/2014 | De Brosse et al. | | |
| 9,076,541 B2 | 7/2015 | Ong et al. | | |
| 9,105,832 B2 | 8/2015 | Buhrman et al. | | |
| 2012/0039119 A1* | 2/2012 | Apalkov | ............... | B82Y 25/00 |
| | | | | 365/171 |
| 2012/0326253 A1* | 12/2012 | Butler | ............... | B82Y 25/00 |
| | | | | 257/421 |
| 2013/0077391 A1* | 3/2013 | Luo | ............... | H01L 43/08 |
| | | | | 365/158 |
| 2013/0134534 A1* | 5/2013 | Sbiaa | ............... | G11C 11/16 |
| | | | | 257/421 |
| 2013/0286723 A1* | 10/2013 | Zhou | ............... | G11C 11/16 |
| | | | | 365/158 |
| 2014/0269035 A1 | 9/2014 | Manipatruni et al. | | |
| 2015/0097159 A1* | 4/2015 | Apalkov | ............... | H01L 43/08 |
| | | | | 257/31 |
| 2015/0200003 A1 | 7/2015 | Buhrman et al. | | |
| 2015/0311901 A1* | 10/2015 | Bromberg | ............... | H01L 43/08 |
| | | | | 326/38 |
| 2016/0171135 A1* | 6/2016 | Datta | ............... | G11C 11/161 |
| | | | | 716/136 |

\* cited by examiner

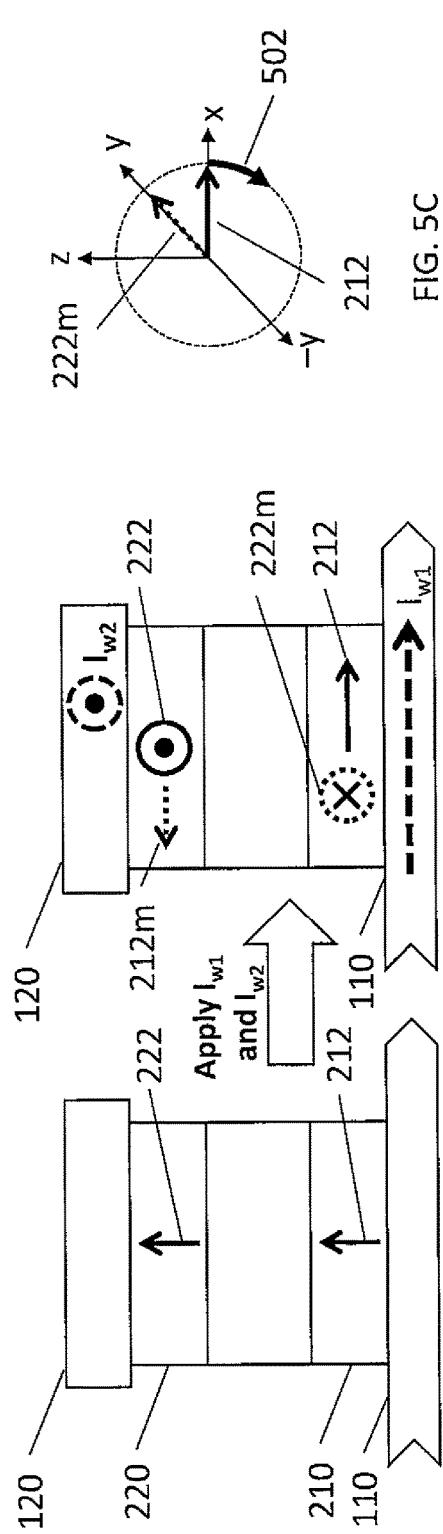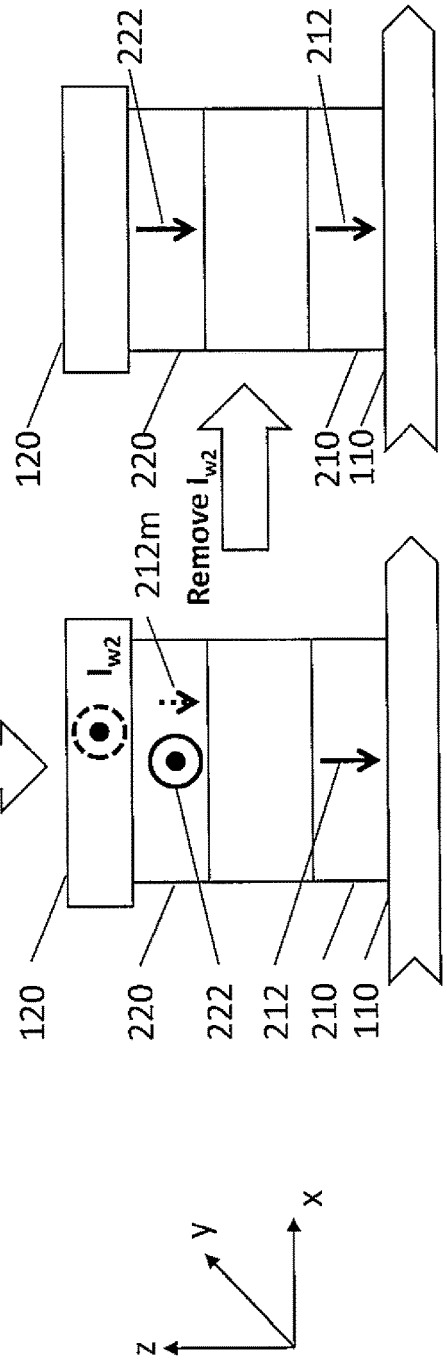
FIG. 5C
FIG. 5B

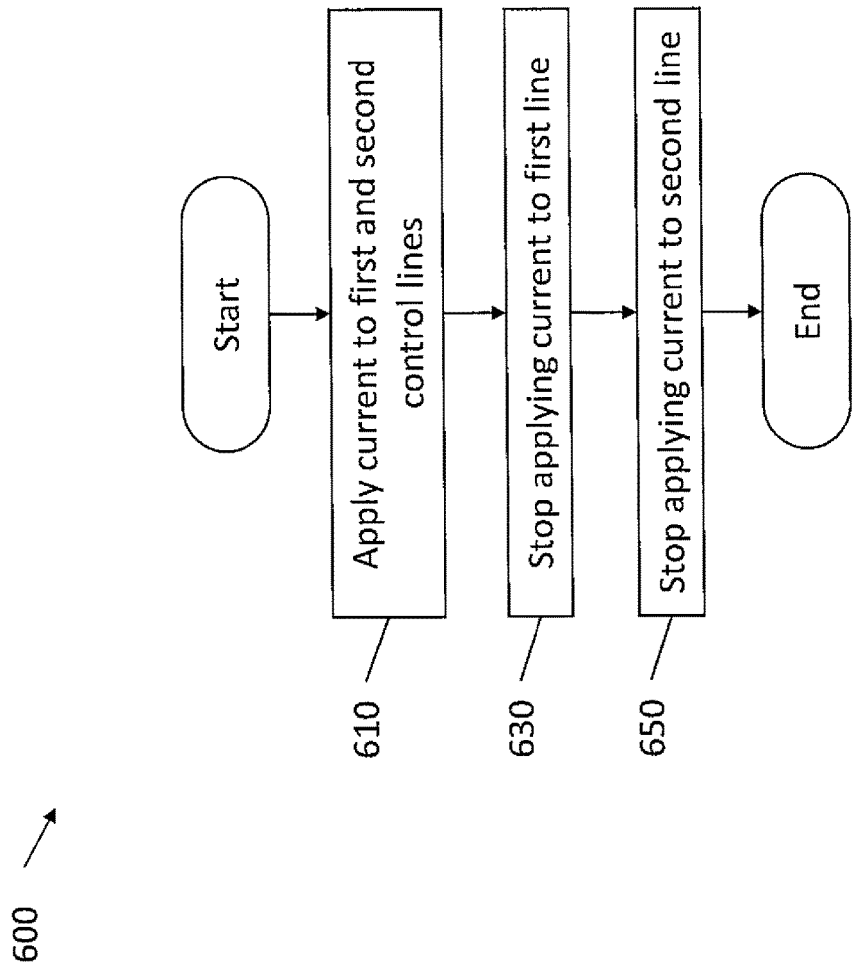

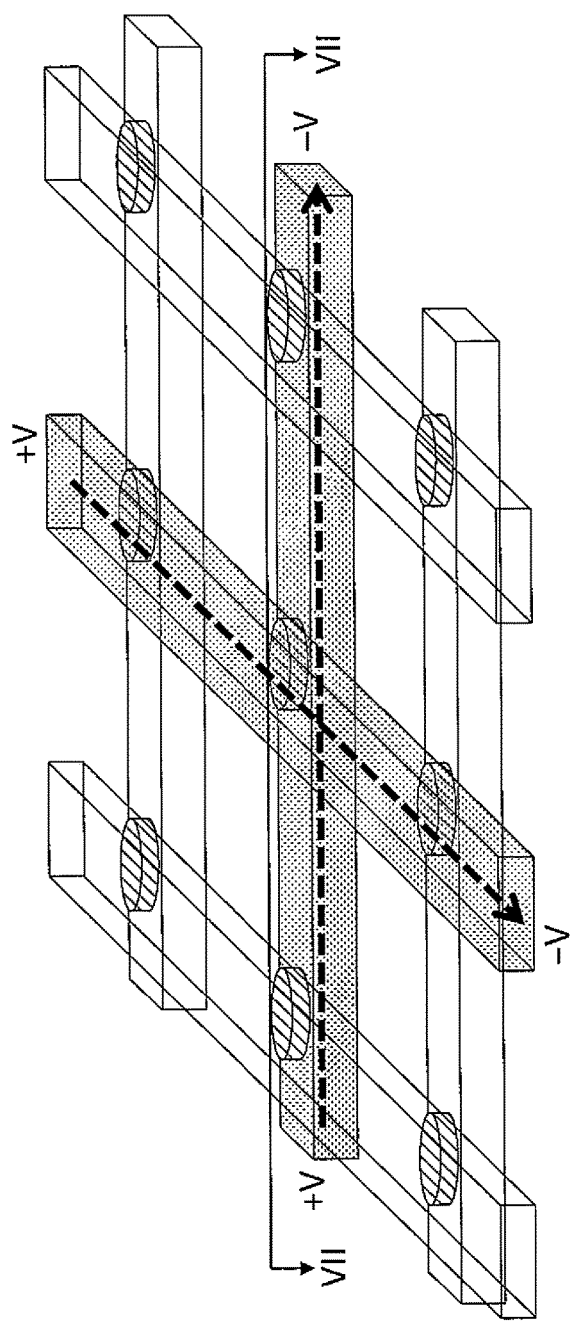
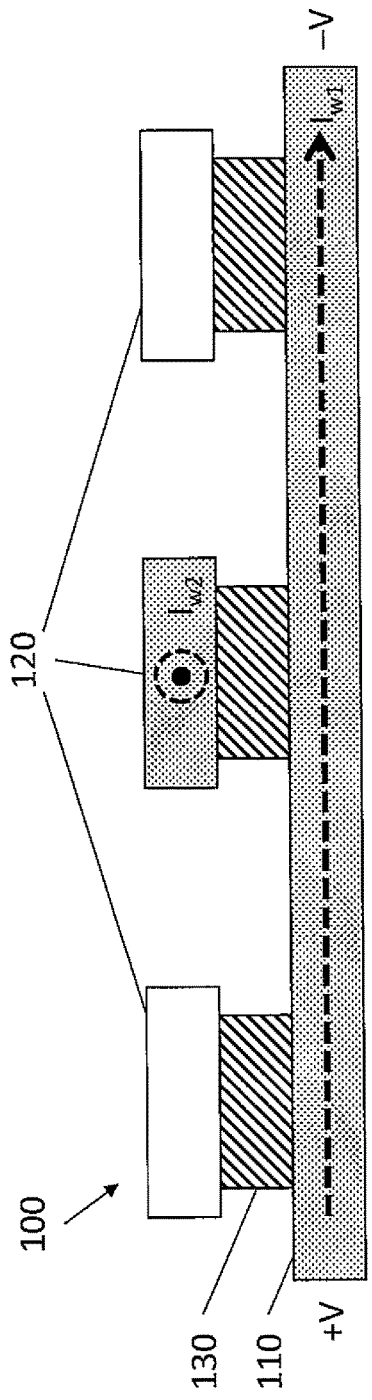
FIG. 7A
FIG. 7B

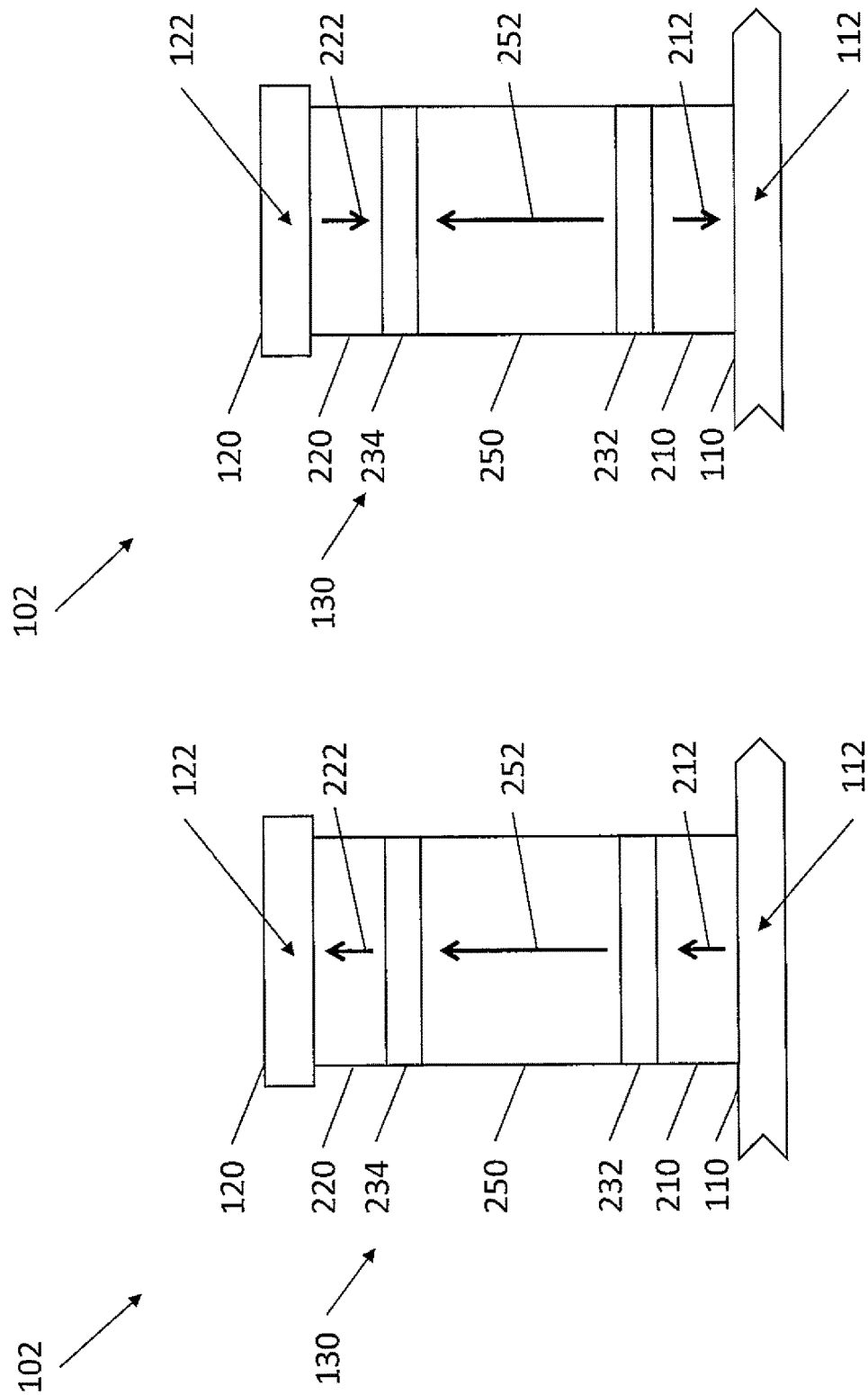

CROSS-POINT ARCHITECTURE FOR SPIN-TRANSFER TORQUE MAGNETORESISTIVE RANDOM ACCESS MEMORY WITH SPIN ORBIT WRITING

CROSS-REFERENCE TO RELATED APPLICATION(S)

This application claims priority to and the benefit of U.S. Provisional Patent Application No. 62/257,686, filed in the U.S. Patent and Trademark Office on Nov. 19, 2015, the entire disclosure of which is incorporated by reference herein.

BACKGROUND

1. Field

Aspects of embodiments of the present invention are directed to spin-transfer torque magnetoresistive random access memory devices.

2. Related Art

Magnetic memory, particularly magnetic random access memories (MRAMs), have drawn increasing interest due to their potential for high read/write speed, high endurance, non-volatility (e.g., persistence), and low power consumption. An MRAM can store information using magnetic materials as an information recording medium. One type of MRAM is a spin transfer torque random access memory (STT-RAM). STT-RAM uses magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state. STT-RAM has the benefits of the fast read and write speed of SRAM, the capacity and cost benefits of DRAM, and the non-volatility of flash memory (e.g., persistence with zero standby power), coupled with high endurance (e.g., greater than $10^{15}$ cycles). As described below, STT-RAM uses a bi-directional current to write data. Such write operations may be performed without assistance from an externally applied magnetic field, heat, or other sources of energy. As such, STT-RAM has low energy requirements for writing.

FIG. 1 depicts a magnetic tunneling junction (MTJ) 10 as it may be used in a STT-RAM 50, as depicted in FIG. 2. The MTJ 10 may be disposed on a bottom contact 11 with a seed layer 12 and may include an antiferromagnetic (AFM) layer 14, a reference (or "pinned") layer 16 having a magnetic moment 17, a tunneling barrier layer 18, a free layer 20, and a capping layer 22. FIG. 1 also shows a top contact 24. The top and bottom contacts 24 and 11 may be coupled to a selection device 62 (as shown in FIG. 2).

The STT-RAM 50 includes a magnetic memory cell 60 including the MTJ 10 and a selection device 62. The selection device 62 is generally a transistor such as an NMOS transistor and includes a drain 66, a source 64, and a gate 68. Also depicted are a word line 72, a bit line 74, and source line 70. The word line 72 is oriented perpendicular to the bit line 74. The source line 70 is typically either parallel or perpendicular to the bit line 74, depending on specific architecture used for the STT-RAM 50. The bit line 74 is connected to the MTJ 10, while the source line 70 is connected to the source 64 of the selection device 62. The word line 72 is connected to the gate 68.

The STT-RAM 50 programs the magnetic memory cell 60 by driving a bi-directional current through the cell 60. In particular, the MTJ 10 is configured to be changeable between high and low resistance states by a current flowing through the MTJ 10. For example, the MTJ 10 may be a magnetic tunneling junction (MTJ) or other magnetic structure that may be written using the spin transfer effect. This may be achieved by ensuring that the MTJ 10 has, for example, a sufficiently small cross-sectional area as well as other features desirable for switching using the spin transfer effect. When the current density is sufficiently large, the current carriers driven through the MTJ 10 may impart sufficient torque to change the state of the MTJ 10. When the write current, such as $I_{w1}$, is driven in one direction, the state may be changed from a low resistance state to a high resistance state. When the write current, such as $I_{w2}$, is passed through the MTJ 10 in the opposite direction, the state may be changed from a high resistance state to a low resistance state.

During write operations, the word line 72 is high and turns on the selection device 62. The write current flows either from the bit line 74 to the source line 70, or vice versa, depending upon the state to be written to the magnetic memory cell 60. The magnetic moment of the free layer 20 may thus be changed. During read operations, the column decoder (not shown) selects the desired bit lines 74. A row decoder also enables the appropriate word line(s) 72. Thus, the word line 72 is high, enabling the selection device 62. Consequently, a read current flows from the bit line 74 to the source line 70. In addition to the read current ($I_{Data}$ in FIG. 2) flowing through the cell being read, reference currents are also driven through reference resistors. The output signals are provided to a sense amplifier. The value stored in the magnetic memory cell 60 is determined by comparing the current flowing through the cell being read to the reference current driven through the separate reference resistors.

However, using perpendicular SO for switching of perpendicular MTJ, as seen in FIG. 1, requires special surface alloy layers that can be more difficult to develop and demonstrate.

The above information disclosed in this Background section is only for enhancement of understanding of the background of the invention and therefore it may contain information that does not constitute prior art.

SUMMARY

Aspects of embodiments of the present invention relate to a spin orbit-switched magnetic tunneling junction (MTJ) cell that does not need an external magnetic field for operation and a method for selecting individual cells in a cross-point array for writing and reading.

In one aspect of embodiments of the present invention, spin orbit-switched magnetic tunneling junctions are arranged in a cross-point architecture having a design that allows writing only cells located at the crossing region of two selected crossing (or intersecting) lines. In one aspect of embodiments of the present invention, the writing is done by spin orbit torque (in-plane) applied through the lines.

According to one embodiment of the present invention, the MTJ cell is perpendicular (to the current flow direction) and has two magnetostatically coupled free layers (FL) with a reference layer (RL) between them. Each free layer is separated from the reference layer by a corresponding tunneling barrier layer (e.g., two MgO layers).

According to one embodiment of the present invention, a differential reading is technique used to read the state of a cell directly, rather than using a separate reference resistor.

According to one embodiment of the present invention, a magnetic memory cell includes: a first spin-orbit interaction active layer; a first magnetic free layer on the first spin-orbit interaction active layer, the first magnetic free layer having a changeable magnetization; a first nonmagnetic spacer layer on the first magnetic free layer; a reference layer having a fixed magnetization on the first nonmagnetic spacer layer; a second nonmagnetic spacer layer on the reference layer; a second magnetic free layer on the second nonmagnetic spacer layer, the second magnetic free layer having a changeable magnetization; and a second spin-orbit interaction active layer on the second magnetic free layer.

The first magnetic free layer and the second magnetic free layer may both exhibit magnetic anisotropy with an easy axis perpendicular to a plane of the first magnetic free layer.

The first spin-orbit interaction active layer may be configured to conduct current along a first direction parallel to a plane of the first spin-orbit interaction active layer, and the second spin-orbit interaction active layer may be configured to conduct current along a second direction parallel to a plane of the second spin-orbit interaction active layer and crossing the first direction.

The first magnetic free layer and the second magnetic free layer may be magnetostatically coupled to one another.

The first spin-orbit interaction active layer and the second spin-orbit interaction active layer may include at least one selected from the group consisting of Pt, Ta, Ti, and W, and the first magnetic free layer and the second magnetic free layer may include one or more of Fe, Ni, Pt, Pd, B, Ta, W, Ir and Co.

The first nonmagnetic spacer layer and the second nonmagnetic spacer layer may include crystalline MgO or MgAlO.

The reference layer may include a ferrimagnetic material having a low magnetic saturation (Ms).

The ferrimagnetic material having a low magnetic saturation may be one of MnGe, MnGa, and MnAl.

The reference layer may include: a first ferromagnetic layer having a fixed magnetization along a direction perpendicular to the reference layer; a second ferromagnetic layer having a fixed magnetization along a direction parallel to the fixed magnetization of the first ferromagnetic layer; a third ferromagnetic layer between the first ferromagnetic layer and the second ferromagnetic layer, the third ferromagnetic layer having a fixed magnetization along a direction antiparallel to the fixed magnetizations of the first and second ferromagnetic layers; a first nonmagnetic layer between the first and third ferromagnetic layers; and a second nonmagnetic layer between the second and third ferromagnetic layers.

The first ferromagnetic layer may be made of $[Co/Pt]_N$/Co, $[Co/Ir]_N$/Co, $[Co/Rh]_N$/Co, or combinations thereof, the second ferromagnetic layer is made of $[Co/Pt]_N$/Co, $[Co/Ir]_N$/Co, $[Co/Rh]_N$/Co, or combinations thereof, and the third ferromagnetic layer is made of $[Co/Pt]_N$/Co, $[Co/Ir]_N$/Co, $[Co/Rh]_N$/Co, or combinations thereof.

The first ferromagnetic layer may be made of $Co/[Pt/Co]_N$, the second ferromagnetic layer may be made of $[Co/Ir]_{2n}$/Co, and wherein the third ferromagnetic layer may be made of $[Co/Pt]_N$/Co.

The first and second nonmagnetic layers may be made of Ru, Ir, Rh or an alloy thereof.

The magnetic memory cell may be one of a plurality of magnetic memory cells, the plurality of magnetic memory cells being arranged in a cross point array, the cross point array may include: a plurality of first control lines extending in a first direction; and a plurality of second control lines extending in a second direction crossing the first direction, the second control lines crossing the first control lines at a plurality of crossing regions, the magnetic memory cells may be at corresponding ones of the crossing regions of the plurality of first control lines and the plurality of second control lines.

The magnetic memory cell may further include a conductive material on the first control lines between adjacent ones of the magnetic memory cells.

According to one embodiment of the present invention, a method for writing a state of a magnetic memory cell may include: a first spin-orbit interaction active layer; a first magnetic free layer on the first spin-orbit interaction active layer, the first magnetic free layer having a changeable magnetization; a first nonmagnetic spacer layer on the first magnetic free layer; a reference layer having a fixed magnetization on the first nonmagnetic spacer layer; a second nonmagnetic spacer layer on the reference layer; a second magnetic free layer on the second nonmagnetic spacer layer, the second magnetic free layer having a changeable magnetization; and a second spin-orbit interaction active layer on the second magnetic free layer, the method may include: applying, concurrently, a first current to the first spin-orbit interaction active layer along a first direction parallel to a plane of the first spin-orbit interaction active layer and a second current to the second spin-orbit interaction active layer along a second direction parallel to a plane of the second spin-orbit interaction active layer and crossing the first direction; stopping the applying of the first current while continuing to apply the second current; and stopping the applying of the second current.

The stopping the applying of the second current may occur 1 to 10 ns after the stopping the applying of the first current.

According to one embodiment of the present invention, a method of reading a state of a memory cell may include: reading a first resistance of the memory cell; writing a known state to the memory cell; reading a second resistance of the memory cell; comparing the first resistance to the second resistance; when the first resistance is equal to the second resistance: determining that the memory cell stored the known state; and when the first resistance is different from the second resistance: determining that the memory cell stored a different state; and writing the different state to the memory cell.

The memory cell may include: a first magnetic free layer having a changeable magnetization; a second magnetic free layer having a changeable magnetization; and a reference layer having a fixed magnetization, the reference layer being between the first magnetic free layer and the second magnetic free layer, and wherein the known state corresponds to a state in which the changeable magnetization of the first magnetic free layer and the changeable magnetization of the second magnetic free layer are both parallel with the fixed magnetization of the reference layer.

The memory cell may include: a first magnetic free layer having a changeable magnetization; a second magnetic free layer having a changeable magnetization; and a reference layer having a fixed magnetization, the reference layer being between the first magnetic free layer and the second magnetic free layer, and the known state may correspond to a state in which the changeable magnetization of the first magnetic free layer and the changeable magnetization of the second magnetic free layer are both antiparallel with the fixed magnetization of the reference layer.

The known state may be a "0" state and wherein the different state may be a "1" state.

The memory cell may include: a first spin-orbit interaction active layer; a first magnetic free layer on the first spin-orbit interaction active layer, the first magnetic free layer having a changeable magnetization; a first nonmagnetic spacer layer on the first magnetic free layer; a reference layer having a fixed magnetization on the first nonmagnetic spacer layer; a second nonmagnetic spacer layer on the reference layer; a second magnetic free layer on the second nonmagnetic spacer layer, the second magnetic free layer having a changeable magnetization; and a second spin-orbit interaction active layer on the second magnetic free layer, and the writing the known state may include: applying, concurrently, a first current to the first spin-orbit interaction active layer along a first direction parallel to a plane of the first spin-orbit interaction active layer and a second current to the second spin-orbit interaction active layer along a second direction parallel to a plane of the second spin-orbit interaction active layer and crossing the first direction; stopping the applying of the first current while continuing to apply the second current; and stopping the applying of the second current.

A total time for reading the state of the memory cell may be in the range of 5 ns to 50 ns

BRIEF DESCRIPTION OF THE DRAWINGS

The accompanying drawings, together with the specification, illustrate example embodiments of the present invention, and, together with the description, serve to explain the principles of the present invention.

FIG. 5B is a schematic illustration of the application of currents to both control lines of a magnetic memory cell according to one embodiment of the present invention.

FIG. 5C is a schematic illustration of the precession of the magnetization of the magnetic free layer around the magnetostatically coupled field from another magnetic free layer according to one embodiment of the present invention.

FIG. 6A is a flowchart illustrating a method for writing to a magnetic memory cell according to one embodiment of the present invention.

FIG. 7A is a schematic perspective view of a cross point array (CPA) according to one embodiment of the present invention, in which current is supplied to two control lines of the cross point array to select one magnetic memory cell.

FIG. 7B is a cross sectional view of the cross point array of FIG. 7A.

FIGS. 8A and 8B depict an exemplary embodiment of a portion of a magnetic memory cell that utilizes spin-orbit interaction in switching according to one embodiment of the present invention, where the figures illustrate the magnetic memory cell in two different states.

DETAILED DESCRIPTION

Figure 1:
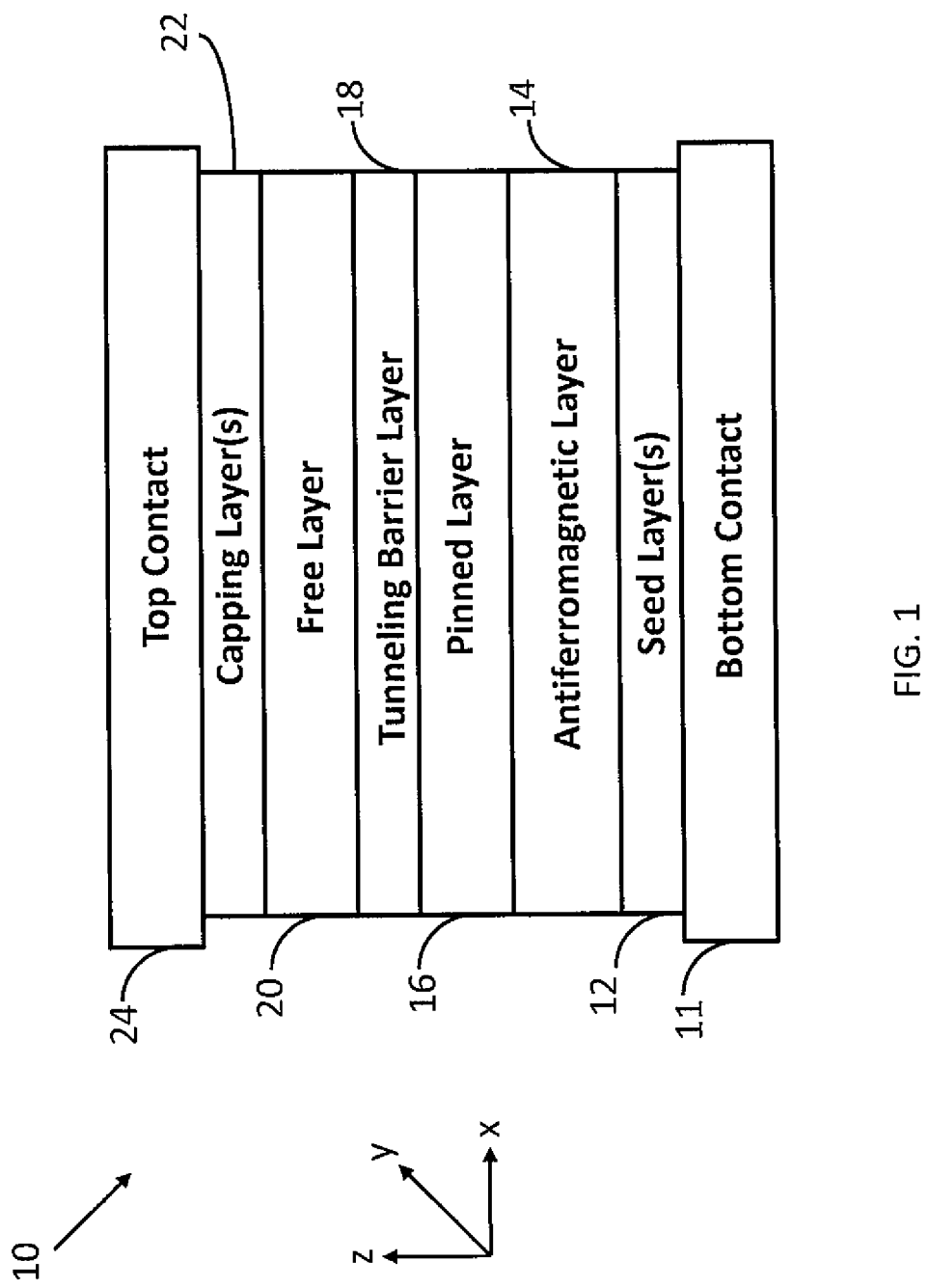
FIG. 1 depicts a magnetic junction.
Figure 2:
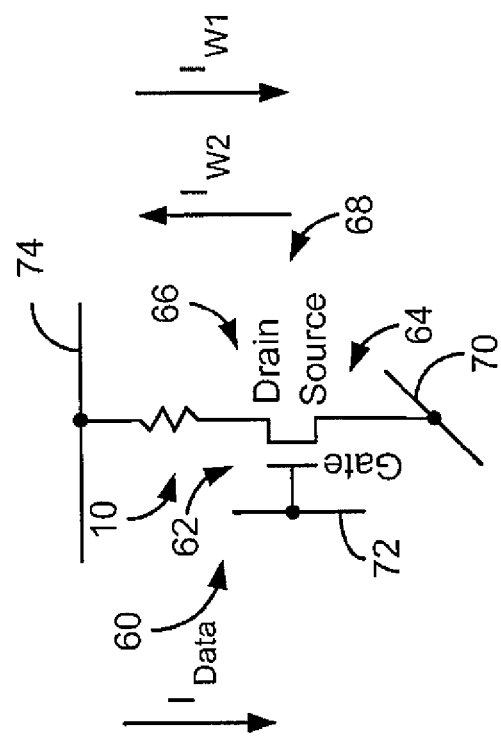
FIG. 2 depicts a portion of a spin transfer torque random access memory.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The example embodiments relate to magnetic memories as well as magnetic junctions usable in such magnetic memories. The following description is presented to enable one of ordinary skill in the art to make and use the invention and is provided in the context of a patent application and its requirements. Various modifications to the example embodiments and the generic principles and features described herein will be readily apparent. The example embodiments are mainly described in terms of particular methods and systems provided in particular implementations. However, the methods and systems will operate effectively in other implementations. Phrases such as "example embodiment," "one embodiment," and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The example embodiments will also be described in the context of particular methods having certain operations. However, the method and system operate effectively for other methods having different and/or additional operations and operations in different orders that are not inconsistent with the example embodiments. Thus, the present invention is not intended to be limited to the embodiments shown, but is to be accorded the widest scope consistent with the principles and features described herein.

The example embodiments describe magnetic memories and methods for providing and programming the magnetic memories. In conjunction with the magnetic memories, the example embodiments describe methods and systems for providing a magnetic memory cell 102 having magnetic free layers that are switched via spin-orbit interactions. The magnetic memory includes cross point arrays (CPAs), intermediate circuitry, global bit lines, and global circuitry. The intermediate circuitry controls read and write operations within the CPAs. Each bit line corresponds to a portion of the CPAs. The global circuitry selects and drives a portion of the bit lines for the read and write operations.

The example embodiments are described in the context of particular magnetic junctions and magnetic memories having certain components. One of ordinary skill in the art will readily recognize that embodiments of the present invention are consistent with the use of magnetic junctions and magnetic memories having other and/or additional components and/or other features not inconsistent with embodiments of the present invention. The method and system are also described in the context of current understanding of spin-orbit interaction, the spin transfer phenomenon, of magnetic anisotropy, and other physical phenomena. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the methods and systems described herein are not dependent upon a particular physical explanation. One of ordinary skill in the art will also readily recognize that the methods and systems are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit interaction active layers, and/or other structures having particular layers. However, one of ordinary skill in the art will readily recognize that magnetic junctions, spin-orbit interaction active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3A:
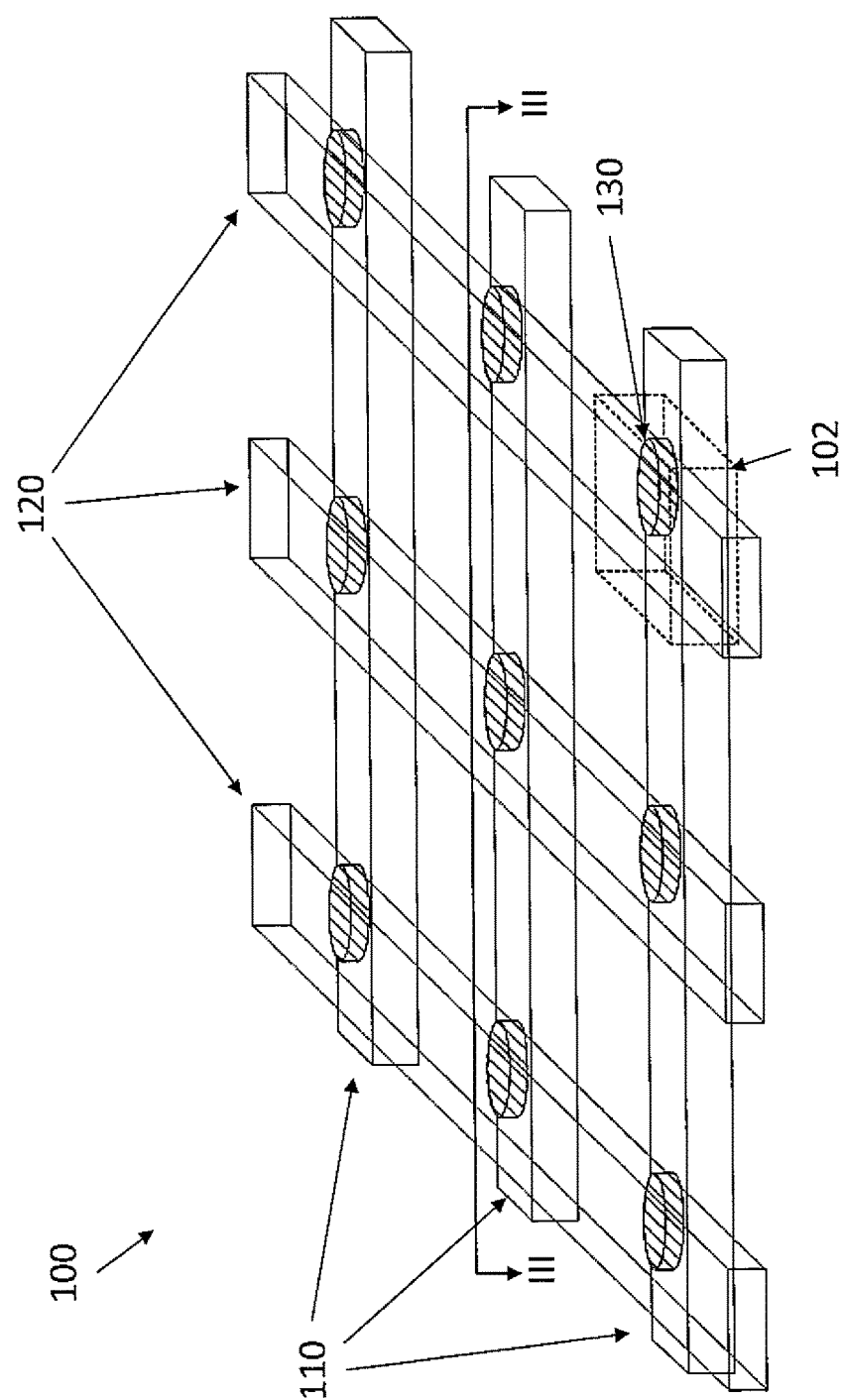
FIG. 3A is a perspective view of a cross point array according to one embodiment of the present invention.
Figure 3B:
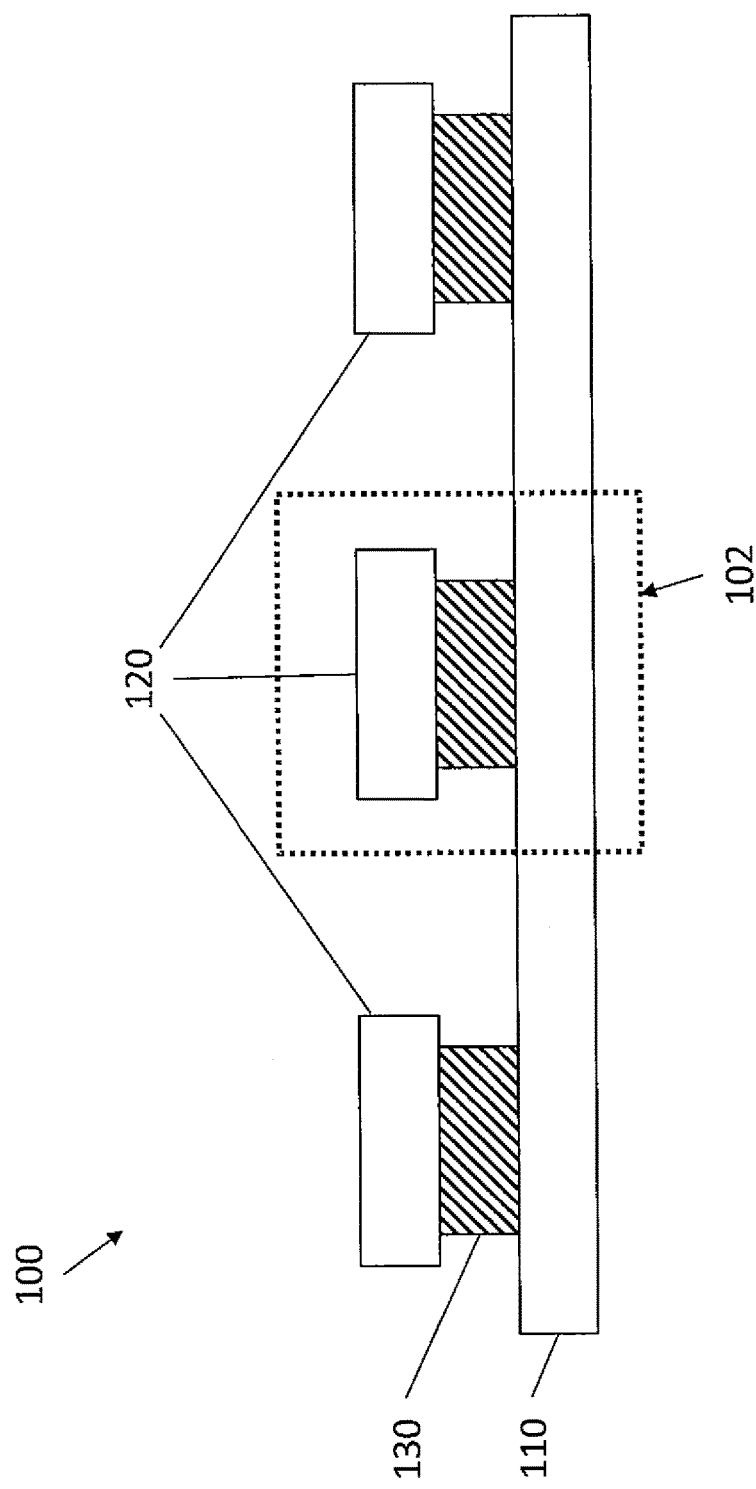
FIG. 3B is a cross-sectional view of a cross point array according to one embodiment of the present invention.

FIG. 3A is a perspective view of a cross point array 100 (CPA) according to one embodiment of the present invention. FIG. 3B is a cross-sectional view of a cross point array 100 according to one embodiment of the present invention taken along the line III-III of FIG. 3A. Each CPA includes first control lines 110 (e.g., word lines), second control lines 120 (e.g., bit lines) crossing (e.g., orthogonal to) the first control lines, and magnetic memory cells 102 (or MTJ cells). The crossing regions of the first control lines 110 and the second control lines 120 correspond to the magnetic memory cells 102, which include magnetic memory devices 130. The size of the CPA may be, for example, 8 cells by 8 cells, 16 cells by 16 cells, etc. A large transistor may be located on the sides and shared across the cells coupled to the line (e.g., 8 cells or 16 cells coupled to a single control line, etc.).

Figure 4:
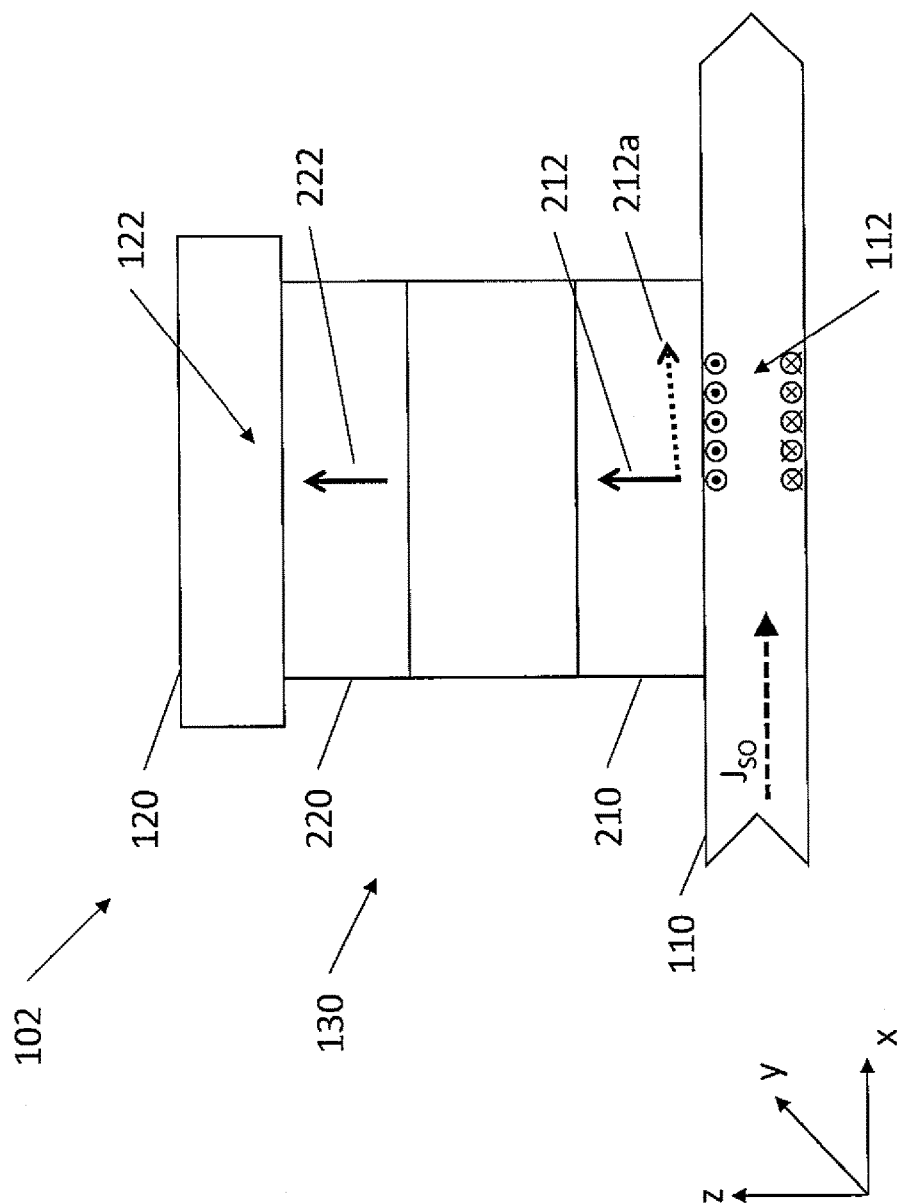
FIG. 4 is a schematic illustration of a magnetic memory cell according to one embodiment of the present invention.

FIG. 4 is a schematic illustration of a magnetic memory cell 102 according to one embodiment of the present invention. As seen in FIG. 4, the magnetic memory cell 102 includes at least two magnetic free layers 210 and 220, and parts of spin-orbit interaction active layers 112 and 122 (or SO active layers) adjacent to respective ones of the magnetic free layers 210 and 220. The magnetic free layers 210 and 220 have changeable magnetizations 212 and 222 (or changeable magnetic moments) and the magnetic free layers 210 and 220 may be perpendicular (e.g., have an easy axis of magnetization along a direction that is perpendicular to the plane(s) of the magnetic free layers or along the z axis as shown in FIG. 4). The magnetic free layers 210 and 220 are magnetostatically coupled to one another. In some embodiments, the magnetic free layers 210 and 220 are not spin torque coupled. The magnetic free layers 210 and 220 may be in contact with respective spin-orbit interaction (SO) active layers 112 and 122 (e.g., magnetic free layer 210 is directly on or contacting first SO active layer 112 and second SO active layer 122 is directly on or contacting magnetic free layer 220). The SO active layers 112 and 122 are made of a spin Hall effect (SHE) material such as platinum (Pt), tantalum (Ta), titanium (Ti), or tungsten (W), but embodiments of the present invention are not limited thereto. The first and second SO active layers 112 and 122 may correspond to the particular first control line 110 and the particular second control line 120 coupled to the particular magnetic memory cell 102 (e.g., the first SO active layer 112 may correspond to the word line and the second SO active layer 122 may correspond to the bit line or the first SO active layer 112 may correspond to the bit line and the second SO active layer 122 may correspond to the word line), but embodiments of the present invention are not limited thereto and the first and second SO active layers 112 and 122 may correspond to other read and write control arrangements.

The SO active layers 112 and 122 are layers that have a strong spin-orbit interaction and that can be used to generate spin-orbit fields for switching the magnetic moments of the magnetic free layers 210 and 220. More specifically, a current is driven in-plane through the SO active layers 112 and 122 coupled to a given magnetic memory cell 102. This may be achieved by driving currents (e.g., $J_{SO}$ shown in FIG. 4 with the dashed line) through the first control line 110 and the second control line 120 coupled to the magnetic memory cell 102. The current through the first SO active layer 112 has an associated spin-orbit interaction that may result in a spin-orbit torque, $T_{SO}$, on the magnetization 212 (or magnetic moment) of the first magnetic free layer 210. Similarly, the current through the second SO active layer 122 has an associated spin-orbit interaction that may result in a spin-orbit torque on the magnetic moment 222 of the second magnetic free layer 220.

In particular, as shown in FIG. 4, due to the spin Hall effect, when an in-plane current $J_{SO}$ flows through the SO active layer 112 (e.g., along the x axis), electrons of different spins are directed in different directions along the z axis. The spin orientation of the electrons injected into the magnetic free layer depends on the direction of the current $J_{SO}$. For example, as illustrated in FIG. 4, if the current $J_{SO}$ flows along the +x direction, then electrons having spin in the +y direction are directed in the +z direction while electrons of opposite spin (−y) are directed in the −z direction. On the other hand, if the current $J_{SO}$ flows in the −x direction, then electrons having spin in the −y direction are directed in the +z direction while electrons of opposite spin (+y) are directed in the −z direction. As such, a spin polarized current $J_s$ is injected into the magnetic free layer 210 in contact with the SO active layer 112, where the orientation of the spin of the injected spin polarized current depends on the direction of the current $J_{SO}$.

The injected spin polarized current $J_s$ applies a torque to the magnetization 212 of the first magnetic free layer 210, which has the effect of redirecting the magnetization 212 in the same direction as the in-plane current $J_{SO}$ (e.g., in the +x direction, as shown by the dotted arrow 212a in FIG. 4). As discussed in more detail below, the magnetic free layers 210 and 220 of the magnetic memory cell 102 are configured to be switched using the SO torque only when current is applied to both SO active layers 112 and 122 corresponding to the magnetic memory cell 102, thereby allowing individual magnetic memory cells of the cross point array to be selected (e.g., when current is applied to the SO active layer 112 on only one side of the cell, the cell does not switch).

The spin-orbit torque on the magnetization 212 of the first magnetic free layer 210 is given by $T_{SO}=-\gamma[M \times H_{SO}]$, where M is the magnitude of the magnetization 212 (or magnetic moment) and $H_{SO}$ is the spin orbit magnetic field corresponding to the spin orbit torque. This mutually correlated torque and field are thus interchangeably referred to herein as spin-orbit field and spin-orbit torque.

The spin-orbit torque $T_{SO}$ may rapidly deflect the magnetization of the magnetic free layer from a stable state parallel to the easy axis. The spin-orbit torque $T_{SO}$ may tilt the magnetization of the magnetic free layer considerably faster than STT torque. As such, the magnetic memory cells 102 are quickly programmable by changing the magnetizations 212 and 222 of the magnetic free layers 210 and 220, as assisted by the SO currents, as described in more detail below.

Figure 5A:
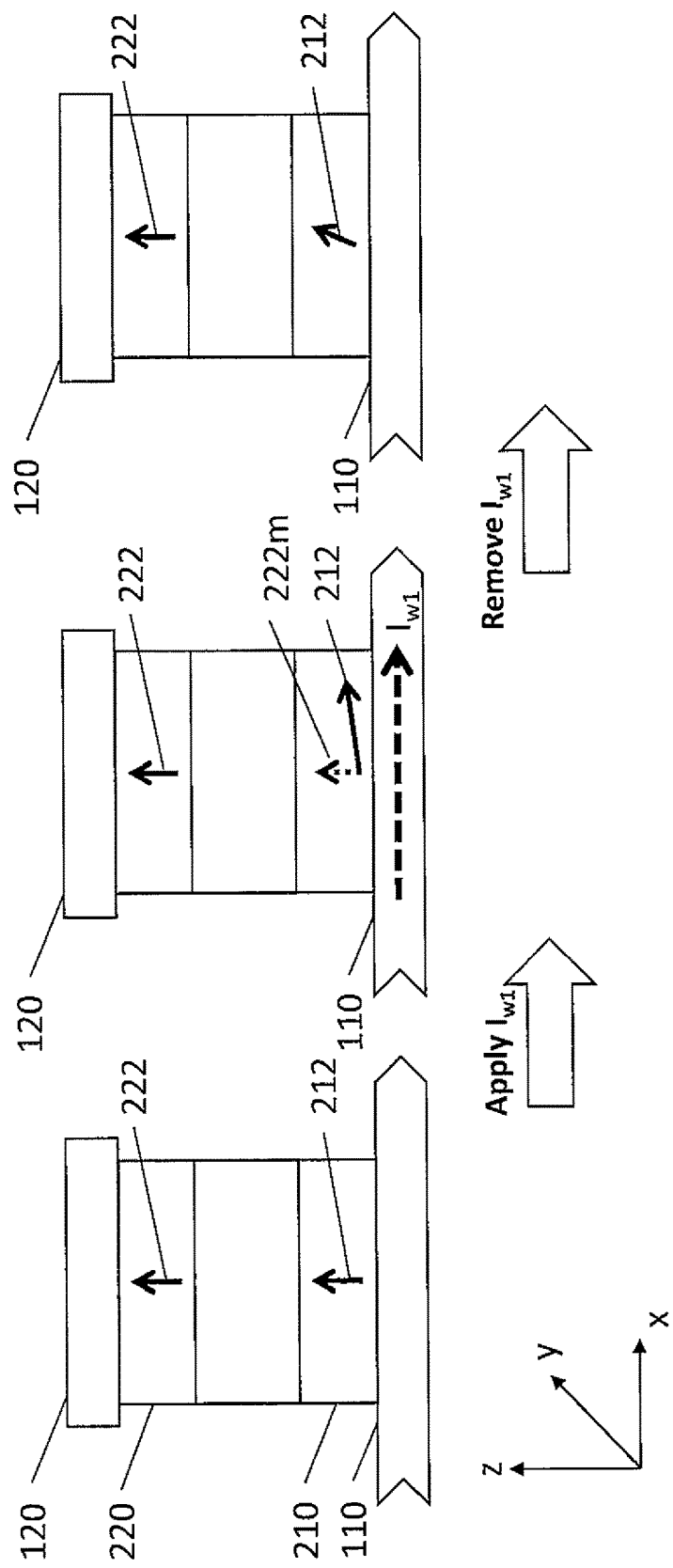
FIG. 5A is a schematic illustration of the application of a current to only one control line coupled to a magnetic memory cell according to one embodiment of the present invention.

FIG. 5A is a schematic illustration of the application of a current to only one control line (e.g., a word line) of a magnetic memory cell 102 according to one embodiment of the present invention. As shown on the left side of FIG. 5A, initially, the magnetizations 212 and 222 of the magnetic free layers 210 and 220 are both oriented in the same, upward direction (e.g., in the +z direction). A current $I_{w1}$ is then applied to one of the SO active areas 112 (e.g., the lower line, as shown in FIG. 5A, where the current $I_{w1}$ is shown with a dashed line). Due to the spin Hall effect (SHE), as shown in the central portion of FIG. 5A, the current $I_{w1}$ applies a torque to the magnetization 212 of the first (e.g., lower) magnetic free layer 210, thereby deflecting its magnetization 212 along the same direction as the current $I_{w1}$ (e.g., in the +x direction). Note that the magnetization 212 of the first magnetic free layer 210 still has a component in the +z direction due to a magnetostatic field 222m arising from the magnetization 222 of the second magnetic free layer 220, as shown by the dotted arrow in the first magnetic free layer 210. As such, when the current $I_{w1}$ is removed, the magnetostatic coupling from the magnetization 222 of the second magnetic free layer 220 substantially restores the magnetization 212 of the first magnetic free layer 210 in the +z direction, as shown on the right side of FIG. 5A.

FIG. 5B is a schematic illustration of the application of currents to both control lines (e.g., the bit line and the word line) of a magnetic memory cell according to one embodiment of the present invention. As shown in the upper left corner of FIG. 5B, like in FIG. 5A, the magnetizations 212 and 222 of the magnetic free layers 210 and 220 are initially both oriented in the same, upward direction (e.g., in the +z direction). A current $I_{w1}$ is applied to one of the SO active areas 112 (e.g., the lower control line 110 as shown in the upper middle of FIG. 5B, the current being shown by the dashed line in the +x direction), and a current $I_{w2}$ is applied to the second control line (e.g., the upper control line 120 as shown in the upper middle of FIG. 5B, the current being shown coming out of the page in the −y direction with the dashed circle). The currents $I_{w1}$ and $I_{w2}$ cause torque to be applied to the magnetizations 212 and 222 of the first magnetic free layer 210 and the second magnetic free layer 220, respectively, such that their magnetizations 212 and 222 are reoriented in a direction parallel to the currents $I_{w1}$ and $I_{w2}$, respectively. The magnetostatic coupling between the first magnetic free layer 210 and the second magnetic free layer 220 results in the application of magnetostatic fields 212m and 222m (shown with the dotted lines in FIG. 5B) in second and first magnetic free layers 220 and 210.

The first current $I_{w1}$ supplied to the first control line is then removed (or reduced to zero) while $I_{w2}$ continues to be applied to the second control line. Without first current $I_{w1}$ applying a torque on the magnetization 212 of the first magnetic free layer 210, which exhibits anisotropy along the z direction, the magnetization 212 is left in an unstable state (e.g., in the +x direction). The anisotropy of the first magnetic free layer 210 will cause its magnetization 212 to relax to point in either the +z direction or the −z direction. Because $I_{w2}$ is still being applied, the magnetization 222 of the second magnetic free layer 220 is still directed in the −y direction and, through magnetostatic coupling, establishes a magnetostatic field 222m through the first magnetic free layer in the −y direction. As a result, as shown in FIG. 5C, the magnetization 212 of the first magnetic free layer 210 precesses along direction 502 around the magnetostatic field 222m established through the magnetostatic coupling, thereby biasing the magnetization 212 of the first magnetic free layer 210 toward the −z direction, as seen in the bottom center portion of FIG. 5B.

Once the magnetization 212 of the first magnetic free layer 210 has stabilized (e.g., in the −z direction as shown in FIG. 5B), it establishes a magnetic field 212m in the second magnetic free layer 222 through magnetostatic coupling. As such, when current $I_{w2}$ is removed, the magnetization of the second magnetic free layer 222 is also left in an unstable state (in the −y direction, which is perpendicular to the z axis perpendicular anisotropy of the second magnetic free layer) and the magnetic field 212m established by the first magnetic free layer 210 biases the magnetization of the second magnetic free layer 222 to relax toward the −z direction. As such, through this process, the magnetizations 212 and 222 of both the first magnetic free layer 210 and the second magnetic free layer 220 are switched.

FIG. 6A is a flowchart illustrating a method 600 for writing to a magnetic memory cell according to one embodiment of the present invention. As shown above with respect to FIG. 5B, in operation 610, current is applied to first and second control lines. In operation 630, the supply of current to the first control line is stopped (or ceased), and in operation 650, the supply of current to the second control line is stopped (ceased).

Figure 6B:
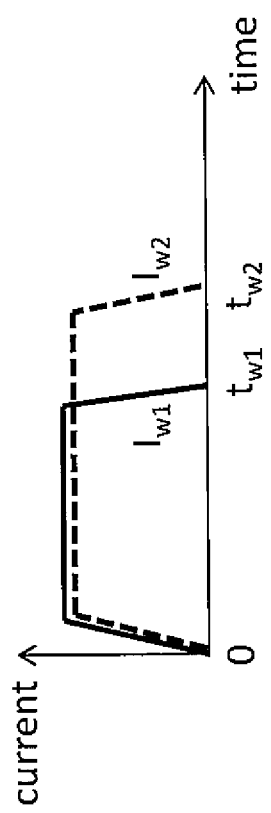
FIG. 6B is a waveform diagram illustrating the currents supplied to the control lines associated with a magnetic memory cell according to one embodiment of the present invention.

FIG. 6B is a waveform diagram illustrating the currents $I_{w1}$ and $I_{w2}$ supplied to the bit line and the word line associated with a magnetic memory cell 102 according to one embodiment of the present invention. As noted above, initially both currents $I_{w1}$ (shown in FIG. 6B as a solid line) and $I_{w2}$ (shown in FIG. 6B as a dashed line) are concurrently applied until time $t_{w1}$ in order to apply torques to the magnetic moments of the first and second magnetic free layers 210 and 220 such that both are oriented along the plane (e.g., in a direction perpendicular to the easy axes of the first and second magnetic free layers 210 and 220. At time $t_{w1}$, the application of current $I_{w1}$ is stopped (e.g., $I_{w1}$ decreases to 0) while current $I_{w2}$ continues to be applied until time $t_{w2}$, at which point $I_{w2}$ also decreases to 0. The difference between time $t_{w2}$ and $t_{w1}$ (in other words, $t_{w2}-t_{w1}$) may be in the range of 1 to 10 nanoseconds. The signs of the current $I_{w1}$ and/or $I_{w2}$ may change based on whether the final state of the magnetic memory cell 102 is desired to be in the +z direction or the −z direction.

FIG. 7A is a schematic perspective view of a cross point array (CPA) according to one embodiment of the present invention, in which current is supplied to one control line extending in a first direction (e.g., a bit line) and one control line extending in a crossing direction (e.g., one word line) of the cross point array to select one magnetic memory cell 102 (e.g., the center cell shown in FIG. 7A). FIG. 7B is a cross sectional view of the cross point array of FIG. 7A. As shown in FIGS. 7A and 7B, the currents $I_{w1}$ and $I_{w2}$ are applied by the voltages V applied to the individual lines and the directions of the currents $I_{w1}$ and $I_{w2}$ can be controlled by altering the voltages applied. The Currents $I_{w1}$ and $I_{w2}$ are illustrated in FIGS. 7A and 7B with dashed lines. As seen in FIGS. 7A and 7B, some magnetic memory cells 102 may have currents applied to one end. However, as previously shown in FIG. 5A, magnetic memory cells that have only one end selected are not switched. As such, only the cell that has currents applied to both control lines (e.g., the center cell in FIGS. 7A and 7B) is selected and written. Therefore, embodiments of the present invention allow for targeted writing of only selected magnetic memory cells.

FIGS. 8A and 8B depict an exemplary embodiment of a portion of a magnetic memory cell 102 that utilizes spin-orbit interaction in switching according to one embodiment of the present invention, where FIGS. 8A and 8B show the magnetic memory cell 102 in two different states. For clarity, FIGS. 8A and 8B are not drawn to scale. The magnetic memory cell 102 may be one of a number of magnetic memory cells in the CPA 100. Also shown is a first control line 110 (e.g., a word line) including a spin-orbit interaction (SO) active layer 112 and a second control line 120 (e.g., a bit line) including a spin-orbit interaction (SO) active layer 122. As discussed above, the first control line 110 extends across multiple memory cells 102, of which only one is shown in FIGS. 8A and 8B. Similarly, the second control line 120 extends across multiple memory cells 102 in a direction crossing the first control line 110. The crossing region of the first control line 110 and the second control line 120 corresponds to the magnetic memory cell 102. In the embodiment shown, the material(s) forming the SO active layers 112 and 122 are only in the vicinity of the memory cell 102. Thus, other materials, including but not limited to higher conductivity and/or nonmagnetic materials, may be used between the cells 102. However, in other embodiments, the first and second control lines 110 and 120 may be made entirely of the spin Hall material of the SO active layers 112 and 122. In still other embodiments, the SO active layers 112 and 122 may be separate from the first and second control lines 110 and 120.

In the embodiment shown, the magnetic memory cell 102 includes a first SO active layer, a first magnetic free layer 210 contacting the first SO active layer 112, a reference layer 250, a first nonmagnetic spacer layer 232 between the first magnetic free layer 210 and the reference layer 250, a second magnetic free layer 220, a second nonmagnetic spacer layer 234 between the reference layer 250 and the second magnetic free layer 220, and a second SO active layer 122 contacting the second magnetic free layer 220. In some embodiments, the first and second nonmagnetic spacer layers 232 and 234 are insulators, for example a tunneling barrier layer. In such embodiments, each spacer layer 232 and 234 may include crystalline MgO, which may enhance the tunnel magnetoresistance (TMR) and spin transfer efficiency of and/or the spin-orbit interaction for the magnetic memory cell 102. In other embodiments, the spacer layers 232 and 234 may be a conductor, such as Cu. In alternate embodiments, the spacer layers 232 and 234 might have another structure, for example a granular layer including conductive channels in an insulating matrix.

In one embodiment of the present invention, as seen, for example, in the embodiment of FIGS. 8A and 8B, the layers of the magnetic memory cell 102 are laminated on one another and therefore each of the layers is substantially planar and the planes of the layers are substantially parallel to each other. As such, as used herein, the term "perpendicular" refers to the direction perpendicular to the planes of the layers (e.g., in the z direction).

As discussed above, the first and second magnetic free layers 210 and 220 have magnetic moments 212 and 222 that are switchable. When the magnetic memory cell 102 is quiescent (not being switched), the magnetic moments 212 and 222 of the magnetic free layer 210 lies along the easy axis of the magnetic free layer 210 (e.g., along the perpendicular direction). The magnetization 252 (or magnetic moment) of the reference layer 250 is substantially fixed in place during operation of the cross point array 100. The reference layer 250 is depicted as a single layer. The magnetic shift (or H-shift) due to the reference layer 250 can cause problems with the operation of the magnetic memory cell 102. As such a material having a low magnetic saturation (Ms) such as MnGe may be used.

The reference layer 250 has a fixed magnetization 252 along a direction that in parallel to the easy axis of the magnetic free layers 210 and 220 (e.g., along the +z direction). As such, changes in the magnetizations 212 and 222 of the magnetic free layers 210 and 220 cause changes in the tunnel magnetoresistance (TMR) of the magnetic memory cell 102 (e.g., when the magnetic free layers 210 and 220 have magnetizations 212 and 222 that are in the same direction as the magnetization 252 of the reference layer 250, then the resistance is lower than when the magnetic free layers 210 and 220 have magnetizations 212 and 222 that are opposite in direction to that of the reference layer.

Figure 9:
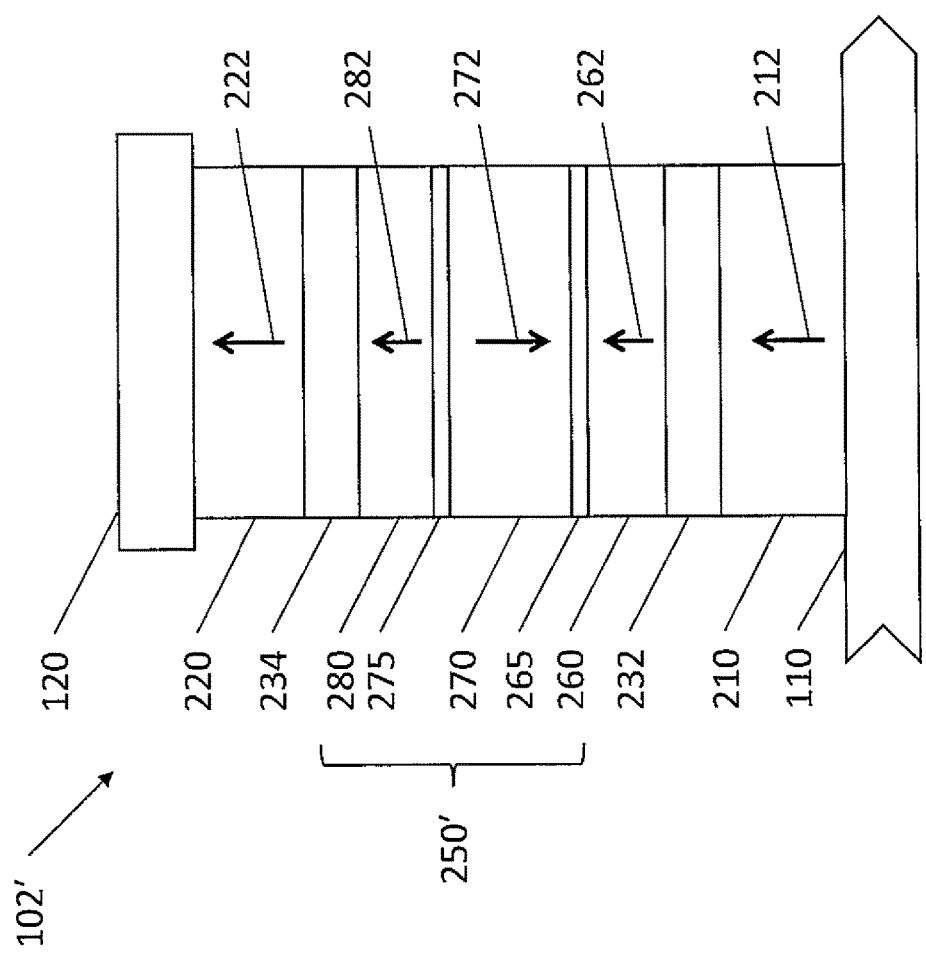
FIG. 9 is a schematic diagram of a magnetic memory cell further including a double synthetic antiferromagnet (SAP) reference layer according to another embodiment of the present invention.

In some embodiments, the reference layer 250 may be a multilayer including, but not limited to a synthetic antiferromagnet having ferromagnetic layers separated by nonmagnetic layer(s) that may be ruthenium (Ru), iridium (Ir), or rhodium (Rh) or an alloy of these materials. FIG. 9 is a schematic diagram of a magnetic memory cell 102' further including a double synthetic antiferromagnetic reference layer 250' that is a multilayer including three ferromagnetic layers 260, 270, and 280, where the three ferromagnetic layers are separated by nonmagnetic layers 265 and 275, which may be made of ruthenium (Ru). Two of the ferromagnetic layers 260 and 280 may have magnetizations 262 and 282 along a first direction (e.g., in the +z direction) while the third ferromagnetic layer 270 is between the other two ferromagnetic layers and has a magnetization 272 in the opposite or antiparallel direction (e.g., the −z direction). The first ferromagnetic layer 260 may be made of Co/[Pt/Co]$_N$, the second ferromagnetic layer 280 may be [Co/Ir]$_{2n}$/Co, and the third ferromagnetic layer 270 may be [Co/Pt]$_N$/Co. In another embodiment, first, second or third ferromagnetic layers can be made of [Co/Pt]$_N$/Co, [Co/Ir]$_N$/Co, [Co/Rh]$_N$/Co, or combinations thereof.

In some embodiments, the magnetic memory cell 102 also includes a pinning layer, such as an antiferromagnetic layer that fixes the magnetic moment 252 of the reference layer 250 in place. In other embodiments, the magnetic moment 252 of the reference layer 250 is fixed in another manner. The magnetic free layers 210 and 220 and the reference layer 250 are ferromagnetic and thus may include one or more of Fe, Ni, and Co.

A magnetic memory cell 102 according to an embodiment of the present invention may maintain one of two different states (e.g., a first state or a second state) in accordance with the magnetization directions 212 and 222 of the magnetic free layers 210 and 220 with respect to the magnetization direction 252 of the reference layer 250. In particular, when the magnetic memory cell 102 is in a first state, as shown in FIG. 8A, the magnetizations 212 and 222 of the magnetic free layers 210 and 220 are parallel with the magnetization of the free layer (e.g., if the magnetization 252 of the reference layer 250 points in the +z direction, the magnetizations 212 and 222 of the magnetic free layers 210 and 220 also point in the +z direction), and when the magnetic memory cell 102 is in a second state, as shown in FIG. 8B, the magnetizations 212 and 222 of the magnetic free layers 210 and 220 are antiparallel with the magnetization of the free layer (e.g., if the magnetization 252 of the reference layer 250 points in the +z direction, the magnetizations 212 and 222 of the magnetic free layers 210 and 220 both point in the −z direction).

The state of the magnetic memory cell 102 can be detected by measuring its electrical resistance. In particular, the electrical resistance is higher in the second state than in the first state. This is because for parallel state, there is a good matching between the available electronic states in the two ferromagnetic layers. The two states may be referred to as a "0" state and a "1" state, without limitation as to which of the "0" and "1" states correspond to the high resistance and low resistance states (e.g., whether low resistance=0 and high resistance=1 or high resistance=0 and low resistance=1).

However, without a reference resistance, it can be difficult to determine whether a particular measured resistance is high or low. In comparative devices, a reference resistance provides a baseline for determining whether the measured resistance is high or low. However, the reference resistance may be located at a very different portion of the circuit than the device being measured, thereby resulting in delay and additional potential errors due to non-uniformities in the manufacturing process.

Figure 10:
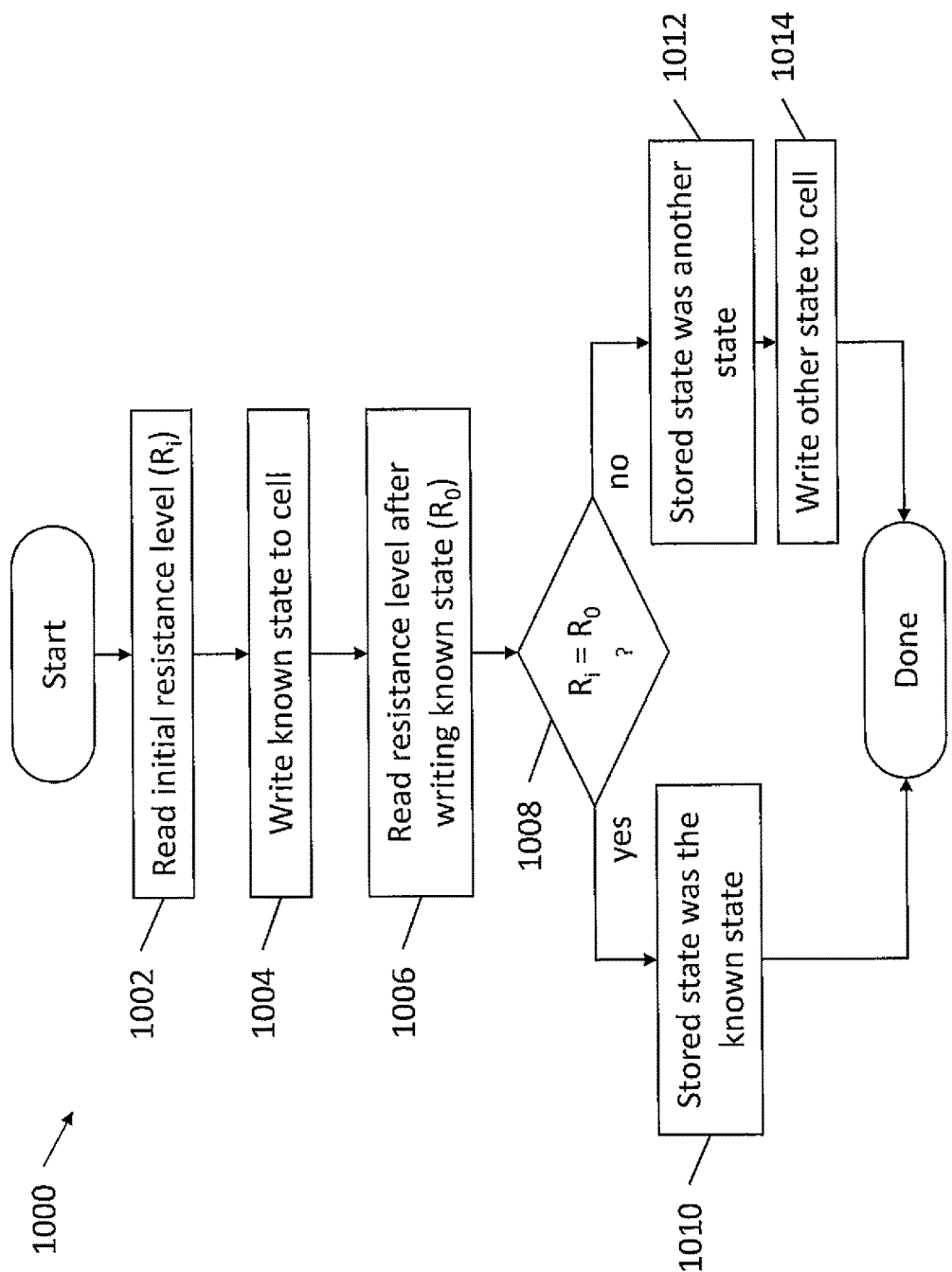
FIG. 10 is a flowchart illustrating a method for reading from a magnetic memory cell according to one embodiment of the present invention.

As such, aspects of embodiments of the present invention are directed to a method for reading a magnetic memory cell. FIG. 10 is a flowchart illustrating a method 1000 for reading from a magnetic memory cell according to one embodiment of the present invention. In operation 1002, the initial resistance level $R_i$ (or first resistance) of the magnetic memory cell 102 is read (e.g., by applying a known current through the magnetic memory cell 102 and measuring the resulting voltage across the magnetic memory cell 102 or applying a known voltage across the magnetic memory cell and measuring the current flowing through the magnetic memory cell 102). In operation 1004, a known state (e.g., the first state or the "0" state) is written to the cell (e.g., the method described above with respect to FIG. 6A). In operation 1006, the resistance level $R_0$ (or second resistance) of the magnetic memory cell, after the known state is written, is measured. In operation 1008, the initial resistance level $R_i$ measured in operation 1002 is compared to the resistance level $R_0$ measured in operation 1006.

If the resistance levels are the same ($R_i=R_0$), then in operation 1010 it is determined that the initial state was the same as the state that was written in operation 1004. For example, if the cell is rewritten to store the "0" state and the resistance is the same before ($R_i$) and after ($R_0$) the write, then the cell must have originally been in the "0" state.

If the resistance levels are different ($R_i \neq R_0$), then in operation 1012 it is determined that the initial state was different from the known state that was written in operation 1004. For example, if the cell is rewritten to store the "0" state and the resistance is different after the write ($R_0$), then the cell must have originally been in the other state, that is, the "1" state. As such, in order to restore the original state of the cell, the other state is written back to the cell in operation 1014 (e.g., to restore the original "1" state that was overwritten with a "0" in operation 1004 using the method described above with respect to FIG. 6A).

As such, embodiments of the present invention allow reading of a magnetic memory cell 102 without the use of an external reference resistance, thereby allowing faster and more reliable operation. In particular, reading the state of a magnetic memory cell 102 involves, in the best case, two resistance readings (operations 1002 and 1006) and one write (operation 1004), and, in the worst case, two resistance readings (operations 1002 and 1006) and two writes (operations 1004 and 1014).

Because method of reading the magnetic memory cell 102 according to embodiments of the present invention is self-referenced (e.g., comparing the measured resistance with its own resistance in a known state), reading can be performed in as little as (2-3 ns), which is much faster than in comparative magnetic memories in which reading may take 10-20 ns. Furthermore, because spin orbit torque is used for the writing, writing can be performed in 1-2 ns, which is much faster than in comparative magnetic memories in which writing is performed in 10-20 ns. As such, a total time for reading a magnetic memory cell 102 according to embodiments of the present invention may be in the range of 5 ns to 50 ns or approximately 20 ns.

Figure 11:
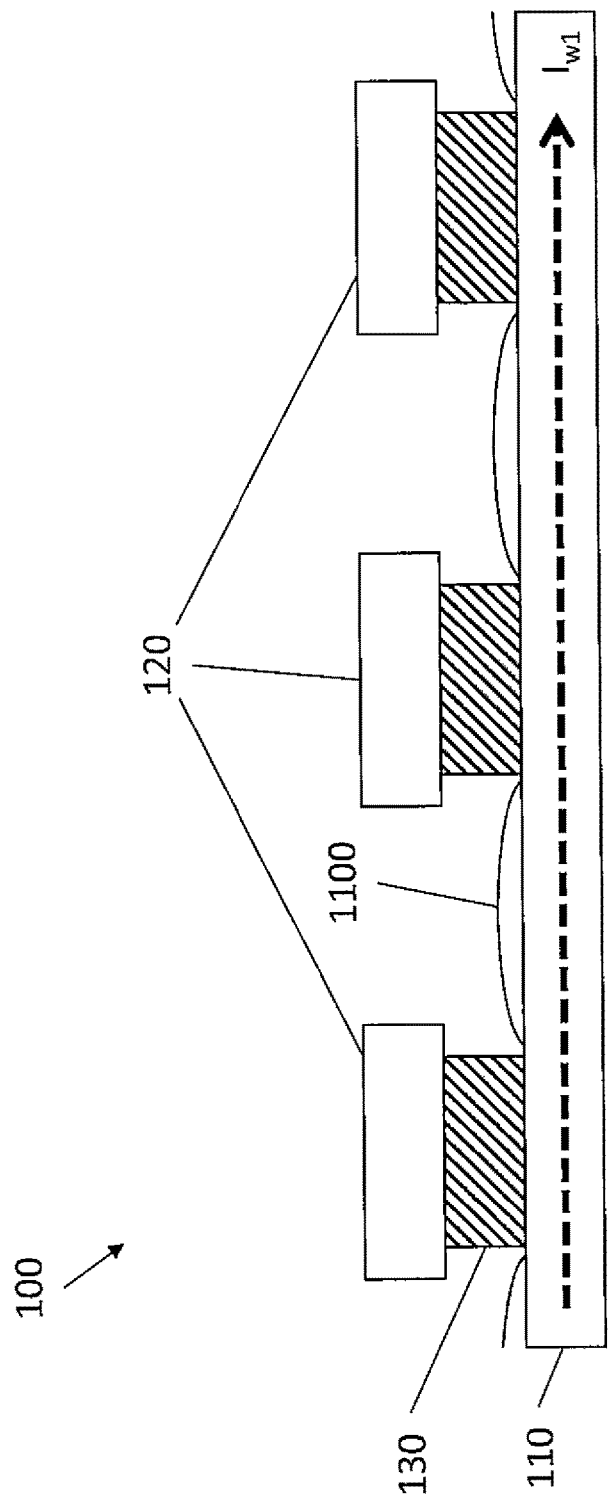
FIG. 11 is a cross sectional view of a cross-point array according further including a conductive material disposed on the control lines to reduce line resistance in one embodiment of the present invention.

FIG. 11 is a cross sectional view of a cross-point array further including a conductive material 1100 having low resistance disposed on the control lines to reduce line resistance in one embodiment of the present invention. The conductive material 1100 may be, for example, cobalt (Co), aluminum (Al), tungsten (W), or tantalum (Ta).

Figure 12:
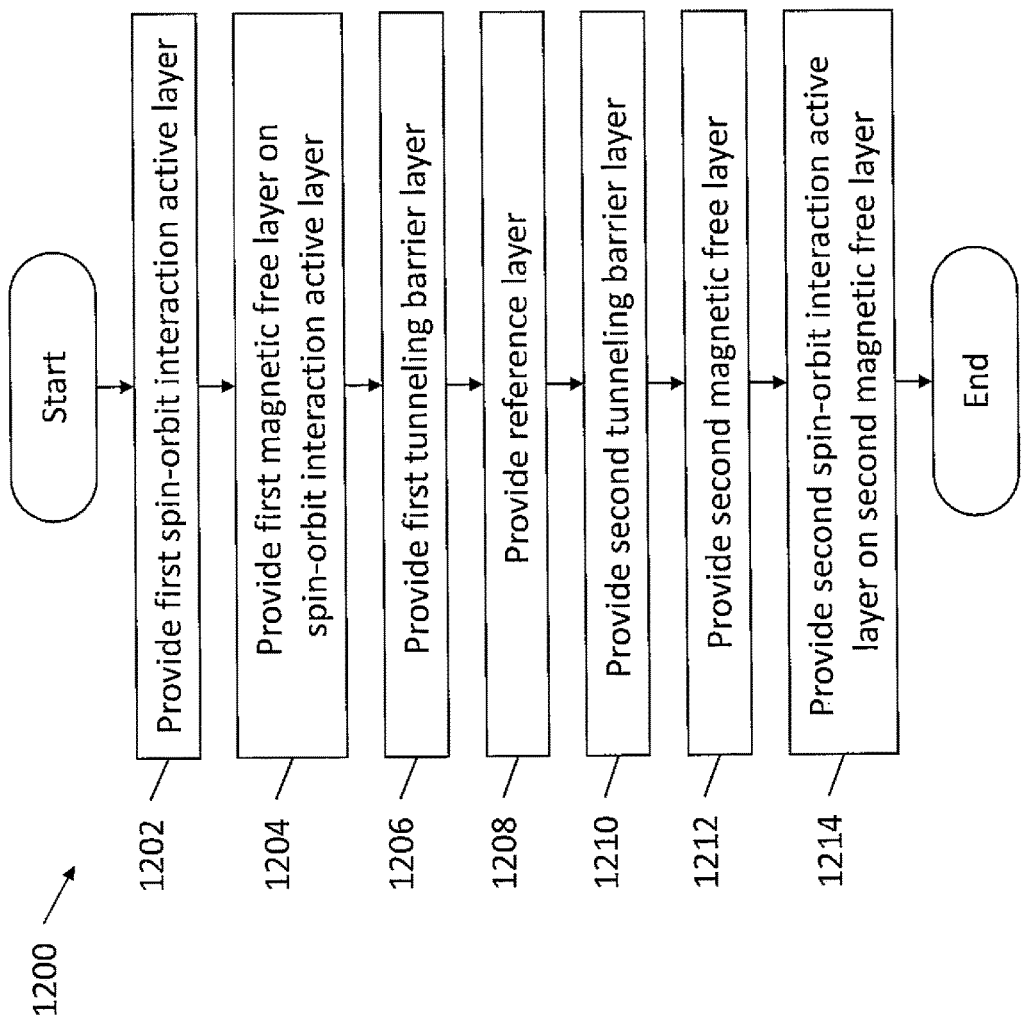
FIG. 12 is a flowchart illustrating a method for manufacturing a magnetic memory cell according to one embodiment of the present invention.

FIG. 12 is a flowchart illustrating a method 1200 for manufacturing a magnetic memory cell 102 (such as the device 130 illustrated in FIG. 8) according to one embodiment of the present invention. In operation 1202, a first spin-orbit interaction active layer 112 is provided (e.g., onto a substrate) and a first magnetic free layer 210 is provided on the spin-orbit interaction active layer 112 in operation 1204. A first nonmagnetic spacer layer 232 is provided on the first magnetic free layer 210 in operation 1206, followed by a reference layer 250 in operation 1208. In operation 1210, a second nonmagnetic spacer layer 234 is provided on the reference layer 250, and in operation 1212, a second magnetic free layer 220 is provided on the second tunneling barrier layer. In operation 1214, a second spin-orbit interaction active layer 122 is provided on the second magnetic free layer 220.

As such, embodiments of the present invention are directed to a spin-transfer torque magnetic memory using spin-orbit writing. Aspects of embodiments of the present invention are also directed to methods of writing and reading a spin-transfer torque magnetic memory according to embodiments of the present invention.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A magnetic memory cell comprising:
a first spin-orbit interaction active layer;
a first magnetic free layer directly on the first spin-orbit interaction active layer, the first magnetic free layer having a changeable magnetization;
a first nonmagnetic spacer layer on the first magnetic free layer;
a reference layer having a fixed magnetization on the first nonmagnetic spacer layer;
a second nonmagnetic spacer layer on the reference layer;
a second magnetic free layer on the second nonmagnetic spacer layer, the second magnetic free layer having a changeable magnetization; and
a second spin-orbit interaction active layer directly on the second magnetic free layer,
wherein the reference layer is between the first magnetic free layer and the second magnetic free layer,
wherein the first spin-orbit interaction active layer and the second spin-orbit interaction active layer comprise at least one selected from the group consisting of Pt, Ta, Ti, and W,
wherein the first magnetic free layer and the second magnetic free layer comprise one or more of Fe, Ni, Pt, Pd, B, Ta, W, Ir and Co,
wherein the reference layer comprises a ferrimagnetic material having a low magnetic saturation (Ms), and
wherein the ferrimagnetic material having a low magnetic saturation is one of MnGe, MnGa, and MnAl.

2. The magnetic memory cell of claim 1, wherein the first magnetic free layer and the second magnetic free layer both exhibit magnetic anisotropy, the magnetic anisotropy of the first magnetic layer having an easy axis perpendicular to a plane of the first magnetic free layer and the magnetic anisotropy of the second magnetic free layer having an easy axis perpendicular to the plane of the first magnetic free layer.

3. The magnetic memory cell of claim 1, wherein the first spin-orbit interaction active layer is configured to conduct current along a first direction parallel to a plane of the first spin-orbit interaction active layer, and wherein the second spin-orbit interaction active layer is configured to conduct current along a second direction parallel to a plane of the second spin-orbit interaction active layer, wherein the second direction crosses the first direction.

4. The magnetic memory cell of claim 1, wherein the first magnetic free layer and the second magnetic free layer are magnetostatically coupled to one another.

5. The magnetic memory cell of claim 1, wherein the first nonmagnetic spacer layer and the second nonmagnetic spacer layer comprise crystalline MgO or MgAlO.

6. The magnetic memory cell of claim 1, wherein the magnetic memory cell is one of a plurality of magnetic memory cells, the plurality of magnetic memory cells being arranged in a cross point array, the cross point array comprising:
a plurality of first control lines extending in a first direction; and
a plurality of second control lines extending in a second direction crossing the first direction, the second control lines crossing the first control lines at a plurality of crossing regions,
wherein the magnetic memory cells are at corresponding ones of the crossing regions of the plurality of first control lines and the plurality of second control lines.

7. The magnetic memory cell of claim 6, further comprising a conductive material on the first control lines between adjacent ones of the magnetic memory cells.

8. A magnetic memory cell comprising:
a first spin-orbit interaction active layer;
a first magnetic free layer on the first spin-orbit interaction active layer, the first magnetic free layer having a changeable magnetization;
a first nonmagnetic spacer layer on the first magnetic free layer;
a reference layer having a fixed magnetization on the first nonmagnetic spacer layer;
a second nonmagnetic spacer layer on the reference layer;
a second magnetic free layer on the second nonmagnetic spacer layer, the second magnetic free layer having a changeable magnetization; and
a second spin-orbit interaction active layer on the second magnetic free layer,
wherein the reference layer comprises a ferrimagnetic material having a low magnetic saturation (Ms), and
wherein the ferrimagnetic material having a low magnetic saturation is one of MnGe, MnGa, and MnAl.

9. A magnetic memory cell comprising:
a first spin-orbit interaction active layer;
a first magnetic free layer on the first spin-orbit interaction active layer, the first magnetic free layer having a changeable magnetization;
a first nonmagnetic spacer layer on the first magnetic free layer;
a reference layer having a fixed magnetization on the first nonmagnetic spacer layer;
a second nonmagnetic spacer layer on the reference layer;
a second magnetic free layer on the second nonmagnetic spacer layer, the second magnetic free layer having a changeable magnetization; and
a second spin-orbit interaction active layer on the second magnetic free layer,
wherein the reference layer comprises:
a first ferromagnetic layer having a fixed magnetization along a direction perpendicular to the reference layer;

a second ferromagnetic layer having a fixed magnetization along a direction parallel to the fixed magnetization of the first ferromagnetic layer;

a third ferromagnetic layer between the first ferromagnetic layer and the second ferromagnetic layer, the third ferromagnetic layer having a fixed magnetization along a direction antiparallel to the fixed magnetizations of the first and second ferromagnetic layers;

a first nonmagnetic layer between the first and third ferromagnetic layers; and a second nonmagnetic layer between the second and third ferromagnetic layers.

10. The magnetic memory cell of claim 9, wherein the first ferromagnetic layer is made of $[Co/Pt]_N/Co$, $[Co/Ir]_N/Co$, $[Co/Rh]_N/Co$, or combinations thereof, wherein the second ferromagnetic layer is made of $[Co/Pt]_N/Co$, $[Co/Ir]_N/Co$, $[Co/Rh]_N/Co$, or combinations thereof, and wherein the third ferromagnetic layer is made of $[Co/Pt]_N/Co$, $[Co/Ir]_N/Co$, $[Co/Rh]_N/Co$, or combinations thereof.

11. The magnetic memory cell of claim 10, wherein the first ferromagnetic layer is made of $Co/[Pt/Co]_N$, wherein the second ferromagnetic layer is made of $[Co/Ir]_{2n}/Co$, and wherein the third ferromagnetic layer is made of $[Co/Pt]_N/Co$.

12. The magnetic memory cell of claim 9, wherein the first and second nonmagnetic layers are made of Ru, Ir, Rh or an alloy thereof.

* * * * *